United States Patent [19]

Brown

[11] Patent Number: 4,559,626
[45] Date of Patent: Dec. 17, 1985

[54] PORTABLE MINICOMPUTER FOR TESTING MEMORIES

[76] Inventor: Carleston O. Brown, 4645 Lark Dr, Beale AFB, Calif. 95903

[21] Appl. No.: 482,127

[22] Filed: Apr. 5, 1983

[51] Int. Cl.⁴ .................................................. G06F 11/16
[52] U.S. Cl. ........................................ 371/21; 364/900
[58] Field of Search ................. 324/73 R; 371/21, 20, 371/25, 27; 364/200, 900

[56] References Cited

U.S. PATENT DOCUMENTS

| | | | |
|---|---|---|---|
| 3,579,199 | 5/1971 | Anderson et al. | 371/21 |
| 3,940,601 | 2/1976 | Henry et al. | 371/20 |
| 4,191,996 | 3/1980 | Chesley | 364/200 |
| 4,300,234 | 11/1981 | Maruyama et al. | 371/27 |
| 4,354,251 | 10/1982 | Hellwig et al. | 371/21 |
| 4,369,511 | 1/1983 | Kimura et al. | 371/21 |
| 4,414,665 | 11/1983 | Kimura et al. | 371/21 |

OTHER PUBLICATIONS

Anolick et al., "Memory Test System", IBM Tech. Disclosure Bulletin, vol. 22, No. 7, (Dec. 1979).
Hollands, et al., "Memory Tester Using Random Addresses and Random Data," IBM Tech. Disclosure Bulletin, vol. 23, No. 1, (Jun. 1980).

Primary Examiner—Jerry Smith
Assistant Examiner—Michael R. Fleming
Attorney, Agent, or Firm—Donald J. Singer; Thomas L. Kundert

[57] ABSTRACT

A portable high speed minicomputer tester is disclosed for isolating failures in a random access memory. The device includes a central processing unit having an address counter and means for generating a plurality of test words. Individual test words are generated automatically and stored in both an internal memory and the memory under test. At a predetermined address, a test word is read out of the memories and compared. If there are any discrepancies, the minicomputer sets a latch corresponding to the failed test word bit and identifies the failed bit on a digital display readout. Using fault conversion tables, an operator can trace a discrepancy to the bit location of a memory chip in the memory under test.

13 Claims, 10 Drawing Figures

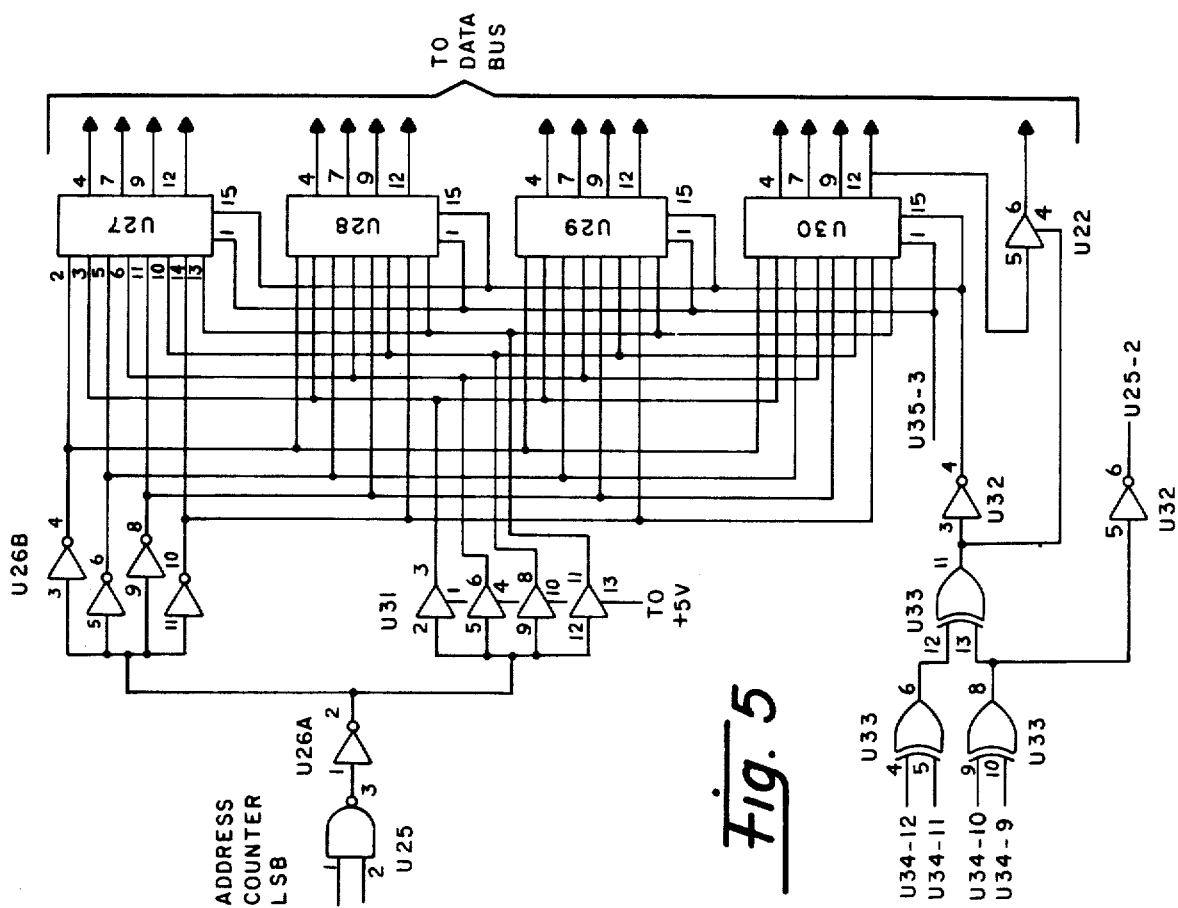
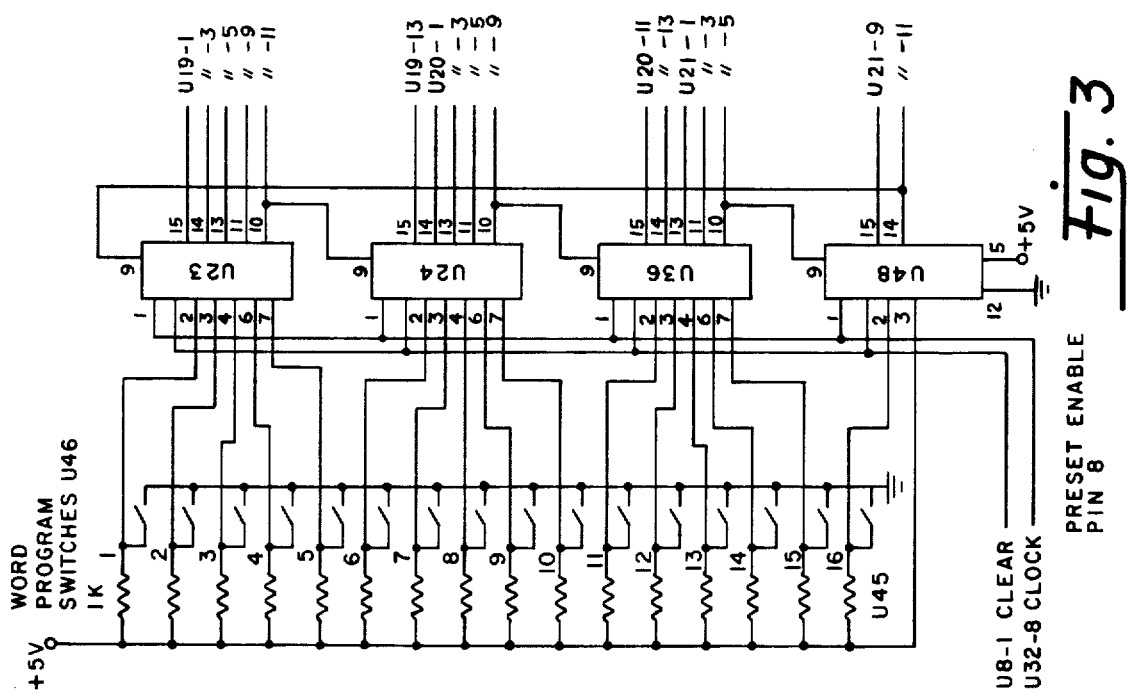

PORTABLE MINICOMPUTER FOR TESTING MEMORIES

RIGHTS OF THE GOVERNMENT

The invention described herein may be manufactured and used by or for the Government of the United States for all governmental purposes without the payment of any royalty.

BACKGROUND OF THE INVENTION

The invention relates to testing of memories and more particularly to a device for locating faults in a memory such as a random access memory.

The random access memory (RAM) is widely used for its capability of permitting arbitrary read and write at any address. To insure that a memory is able to properly store and maintain data, various diagnostic testing equipment has been introduced to check the function and operation of the memory.

U.S. Pat. No. 3,940,601 to Henry et al shows a prior art test device for locating faults in a working storage. The device includes an auxiliary storage which holds a sequence of test words and for cyclically writing the test words into the working storage reading the test words out of the working storage. A bit for bit word comparator compares the words read out of the working storage with the words read into the working storage and detects bits of the words which do not match in order to identify defective components. First and second registers record the row and the column to which the defective component belongs.

U.S. Pat. No. 4,300,234 to Maruyama et al discloses another test device including an address pattern generator for testing semiconductor memories such as a random access memory.

The present invention was designed and built especially to test memory cards of the general purpose signal processor unit of the AN/FPS-115 radar system. The need for the invention became apparent when it was found that implementation of available diagnostic tests failed to detect whether every card of the general purpose signal processor was functioning properly. In certain situations the diagnostic tests were unable to identify a memory failure. After careful evaluation, it was determined that the radar system operated at a much higher frequency than the frequency in which the memories were being tested, and as a result memory failures were most likely related to timing errors generated within the memory itself. Prior to the invention, diagnostic tests were unable to adequately detect and locate all malfunctions in memory modules of the general purpose signal processor, and as a result entire memory modules had to be replaced, and the faulty modules returned for costly depot maintenance.

An object of the present invention is to provide test apparatus for testing a random access memory at its normal operating frequency.

Another object of the invention is to provide a test apparatus capable of isolating failures in large memory modules at a high rate of speed.

Still another object of the invention is to provide a portable self-contained minicomputer that requires no software and which generates a series of test words for testing a memory.

SUMMARY OF THE INVENTION

The subject invention is directed to a portable minicomputer tester which isolates failures of a random access memory (RAM) down to an individual integrated circuit (IC) component. Within the minicomputer a central processing unit (CPU) generates sets of test words which are stored both in a memory under test and in an internal memory circuit. The computer further includes an address counter. Once the counter reaches a preset address, it is reset to zero, and data in the memory under test and the computer's internal memory are compared. If there are any discrepancies, the minicomputer will terminate the test and set a latch corresponding to the failed bit. An operator then isolates the failure by setting a fault switch on the front control panel of the computer, enabling a fault display circuit which identifies the failed bit(s) on a digital display readout. Using a fault conversion chart, failures can be narrowed down to the bit location of a single IC component of the memory under test.

Other features and advantages of the invention will be apparent from the following description and claims, and are illustrated in the accompanying drawings which show an embodiment of the invention.

BRIEF DESCRIPTION OF THE DRAWINGS

FIGS. 3 and 4 are schematic diagrams of the generator circuit for test words Nos. 2 and 3;

FIG. 5 is a schematic diagram of the generator circuit for test words Nos. 4, 5, 6 and 7;

DETAILED DESCRIPTION

Figure 1:
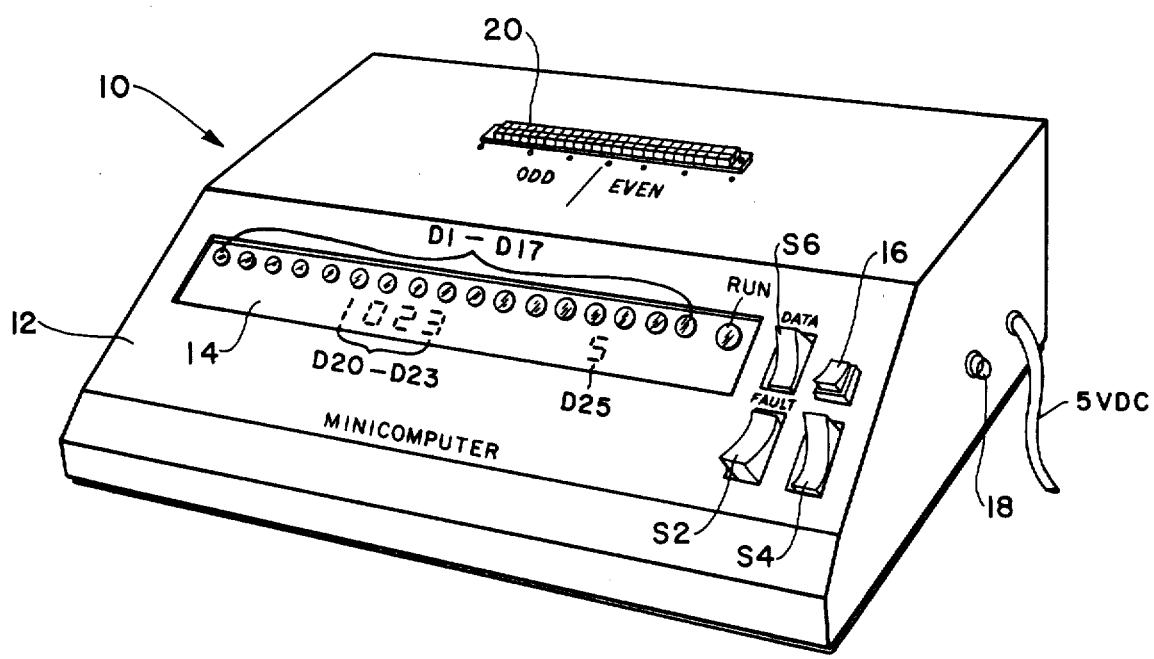
FIG. 1 is a perspective view showing the cabinet and front control panel of the portable minicomputer tester according to the invention.

FIG. 1 illustrates the portable minicomputer memory tester according to the invention. The tester may be housed in a cabinet 10 having front panel 12 with a digital display readout 14. Printed circuit memory cards from the general purpose signal processor of the AN/FPX-115 radar containing the memories to be tested are connected to the tester through receptacle 20. Power for the unit may be supplied by an external 5 VDC source (not shown) and is controlled by an on-off switch 16. A source of clock signals for the tester may be supplied from an external source through jack 18. For purposes of the invention, the source of clock signals may comprise a Hewlett-Packard Model HP8005B pulse generator operated at between 10 kHz and 6 MHz. Alternatively, the clock signal could be generated internally by a suitable oscillator circuit. Additional switches S2 and S4 on front panel 12 are provided to clear and start various counter circuits within the minicomputer.

The computer consists of three main subunits, a central processing unit (CPU), an internal memory, and a digital display readout. The CPU includes an address counter and circuitry for generating 7 test words which are stored both in the memory under test and the internal memory. Once the address counter reaches a predetermined address, data in the memory under test and the internal memory are compared. If there are any discrepancies, the minicomputer will terminate the test. An operator isolates a failure by setting a fault display switch S6 on the front control panel causing the failed bit(s) to be identified on digital display readout 14. With the assistance of a fault conversion chart, the operator can trace the failure to the bit location a single memory chip on the memory card.

The 7 test words generated by the CPU are as follows.

| TEST WORD | DESCRIPTION |
| --- | --- |
| 1 | Address Test (address data loaded into memory under test and the internal memory). |
| 2 | Walking Ones (binary ones walked through a field of zeros are loaded into the memory under test and the internal memory). |
| 3 | Walking Zeros (binary zeros walked through a field of ones are loaded into the memory under test and the internal memory). |
| 4 | Alternating Ones & Zeros (binary data alternating from a logic "1" to a logic "0" is loaded into the memory under test and the internal memory). |
| 5 | Alternating Zeros & Ones (binary data alternating from a logic "0" to a logic "1" is loaded into the memory under test and the internal memory). |
| 6 | All Zeros (binary "0's" loaded into the memory under test and the internal memory). |
| 7 | All Ones (binary "1's" loaded into the memory under test and the internal memory). |

Individual parts of the CPU include the address counter, 7 test word generators, a test select circuit, a write/read circuit, and a data/fault circuit. There now follows a description and the operation of these parts together with a description and the operation of the internal memory and digital display readout.

ADDRESS COUNTER AND TEST WORD GEN No. 1

Figure 2:
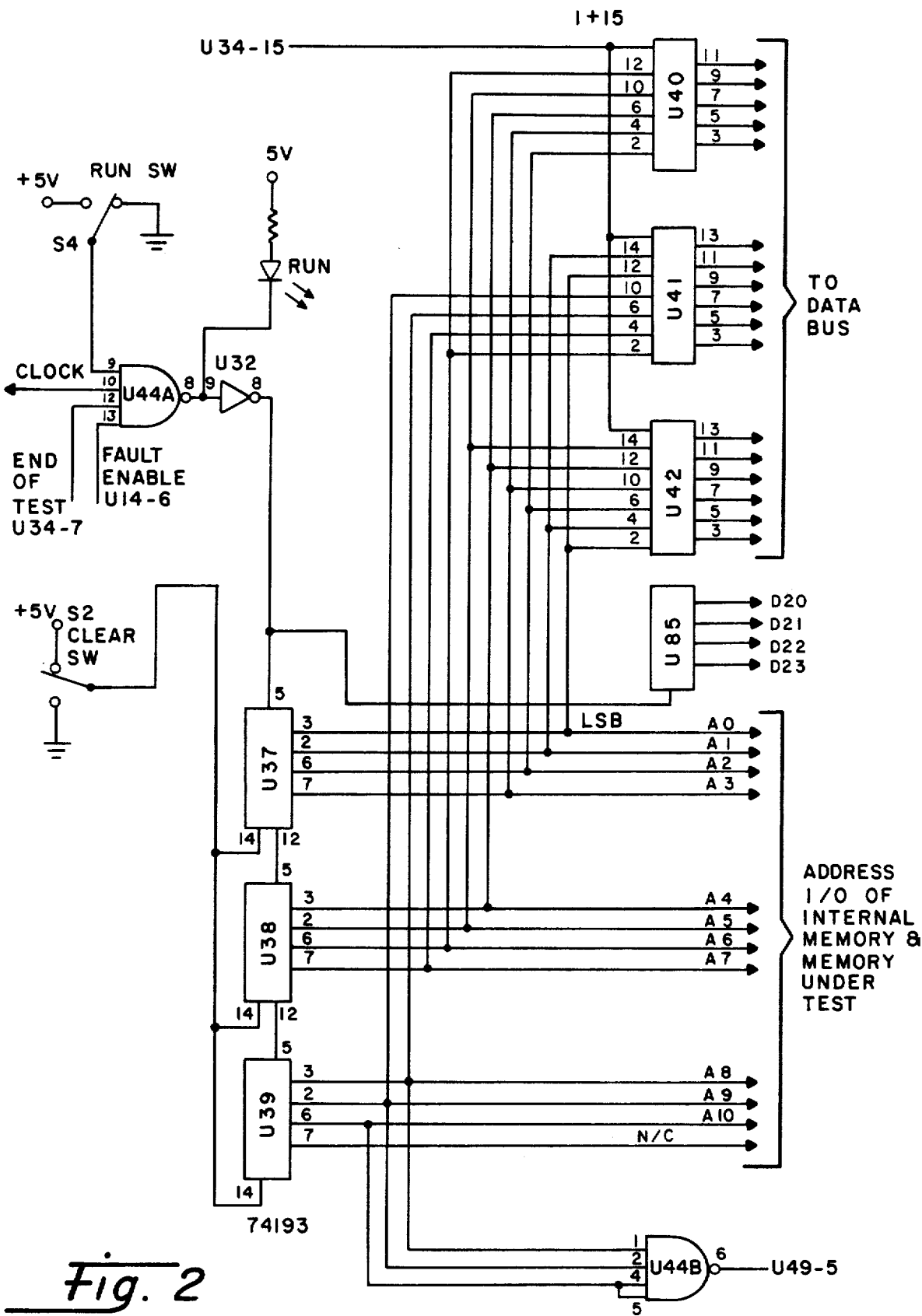
FIG. 2 is a schematic diagram of the address counter and test word No. 1 generator circuit.

The address counter and test word generator No. 1 are shown in FIG. 2. The circuit comprises binary counters U37–U39, noninverting buffer amplifiers U40-42, NAND gates U44A and U44B, and logic inverter U32. The address counter portion of the circuit is formed by the binary counters U37–U39. The counters are cleared by operation of switch S2 from the control panel, and count the clock pulses applied to pin 10 when run switch S4 is set to apply a logic high to pin 9 of NAND gate U44A with pin 12 (End of Test) and pin 13 (Fault Enable) also at logic high. The counting action of the address counter is controlled by a logic low on output pin 8 of NAND gate U44A which is converted to a logic high by inverter U32. The output of NAND gate U44A is also used to enable a RUN light emitting diode (LED) indicator on the digital display readout 14.

Output lines A0–A10 of binary counters U37–U39 are connected to the address lines of both the internal memory (FIG. 10) and the memory card under test (not shown). The binary output of counters U37–U39 also comprise the first test word to be loaded into the minicomputer internal memory and the memory card under test. Test word No. 1 is applied to noninverting buffer amplifiers U40–U42 for isolation and amplification. The buffers are energized by a logic low applied to pins 1 and 15, causing test word No. 1 to be selected and applied to a data bus for transfer to the data inputs of the internal memory and memory under test. When input lines (pins 1 and 15) are set to a logic high (i.e., deenergized), the output of the buffers return to a high impedance state.

The output of inverter U32 is also used to drive a 4-place decade counter circuit U85 of conventional design which produces a decimal count corresponding to the binary address counter output. The outputs of 4-place decade counter circuit U85 are connected to 7-segment LED numerical readout indicators D20–D23 located on front panel 12 of the minicomputer to provide an instantaneous address counter readout for the operator. The decade counter is programmed to reset after reaching a predetermined decimal count of 2048, which is twice the number of addresses in individual RAM chips used in the internal memory and the memory card under test.

TEST WORD GENERATOR Nos. 2 and 3

Figure 4:
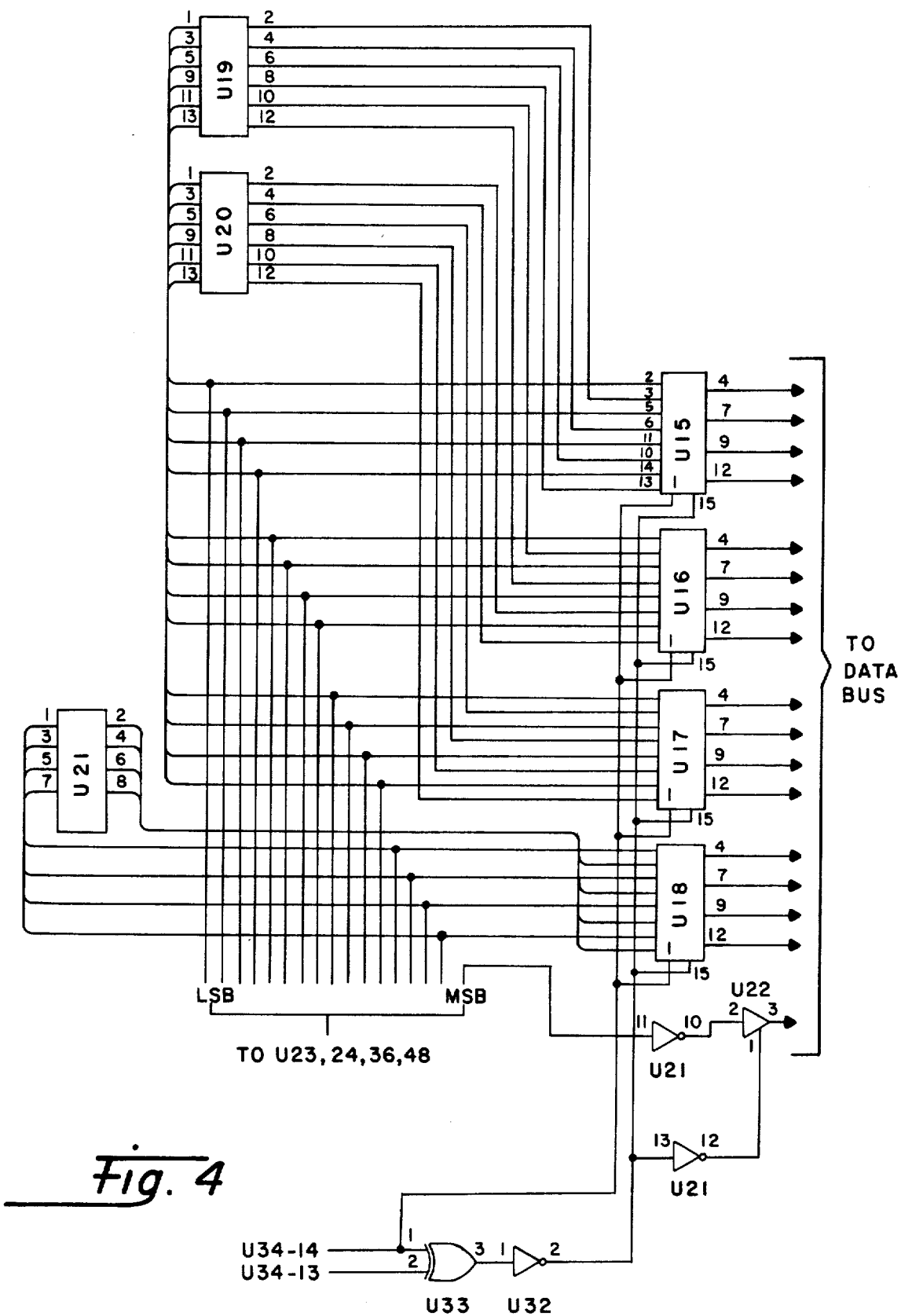

Referring now to FIGS. 3 and 4, the circuit for generating test words Nos. 2 and 3 consists of shift registers U23, U24, U36 and U48, word program microswitches U46, 1K resistors U45, hexinverters U19–U21, multiplexers U15–U18, logic inverters U22 and U32, and exclusive OR gate U33.

Test word Nos. 2 and 3 are programmable and are normally set to allow a walking one through a field of zeros and a walking zero through a field of ones. Walking ones and zeros are accomplished by first setting the desired logic information on microswitches U46, followed by a preset pulse on pin 8 of each shift register. The preset pulse will load the word program switch values into the corresponding registers which are then applied to the output of each register. When the clock input (pin 1) from NAND gate U32, pin 8 (FIG. 2) is pulsed, the outputs are serially shifted through the registers. The output of the registers are applied through hexinverters U19–U21 to the input of multiplexers U15–U18. The output of hex inverters U19–U21 will invert the shift register data and apply them to four of the input lines of each of the multiplexers U15–U18 while the other four inputs of the multiplexers will receive the noninverted data from the shift registers. The outputs of the multiplexers are connected to the data bus for transfer to the data inputs of the internal memory and memory card under test. The selection of inverted or noninverted data are controlled by the binary code applied from test word selector multiplexer U34 (FIG. 6) to pins 1 and 2 of exclusive OR gate U33. With pin 1 low and 2 high, test word No. 2 (walking ones) is selected. However, the information is not relayed to the data bus until pin 15 of multiplexers U15–U18 is low. This occurs whenever pins 1 and 2 of exclusive OR gate U33 are at different logic levels. Test word No. 3 is selected when pin 1 is high and 2 is low. At the end of test word No. 3, multiplexer U34 applies a high to both pins 1 and 2, causing a high to appear on pin 15 of multiplexers U1-5–U18 so that their output lines will return to a high (i.e., deenergized) impedance state.

TEST WORD GENERATOR NOS. 4, 5, 6 and 7

FIG. 5 shows the circuit for remaining test word generators Nos. 4, 5, 6 and 7. The circuit consists of NAND gate U25, hex inverters U26A, U26B, and U32, noninverting gates U31 and U22, exclusive OR gates U33, and multiplexers U27-U30.

Figure 6:
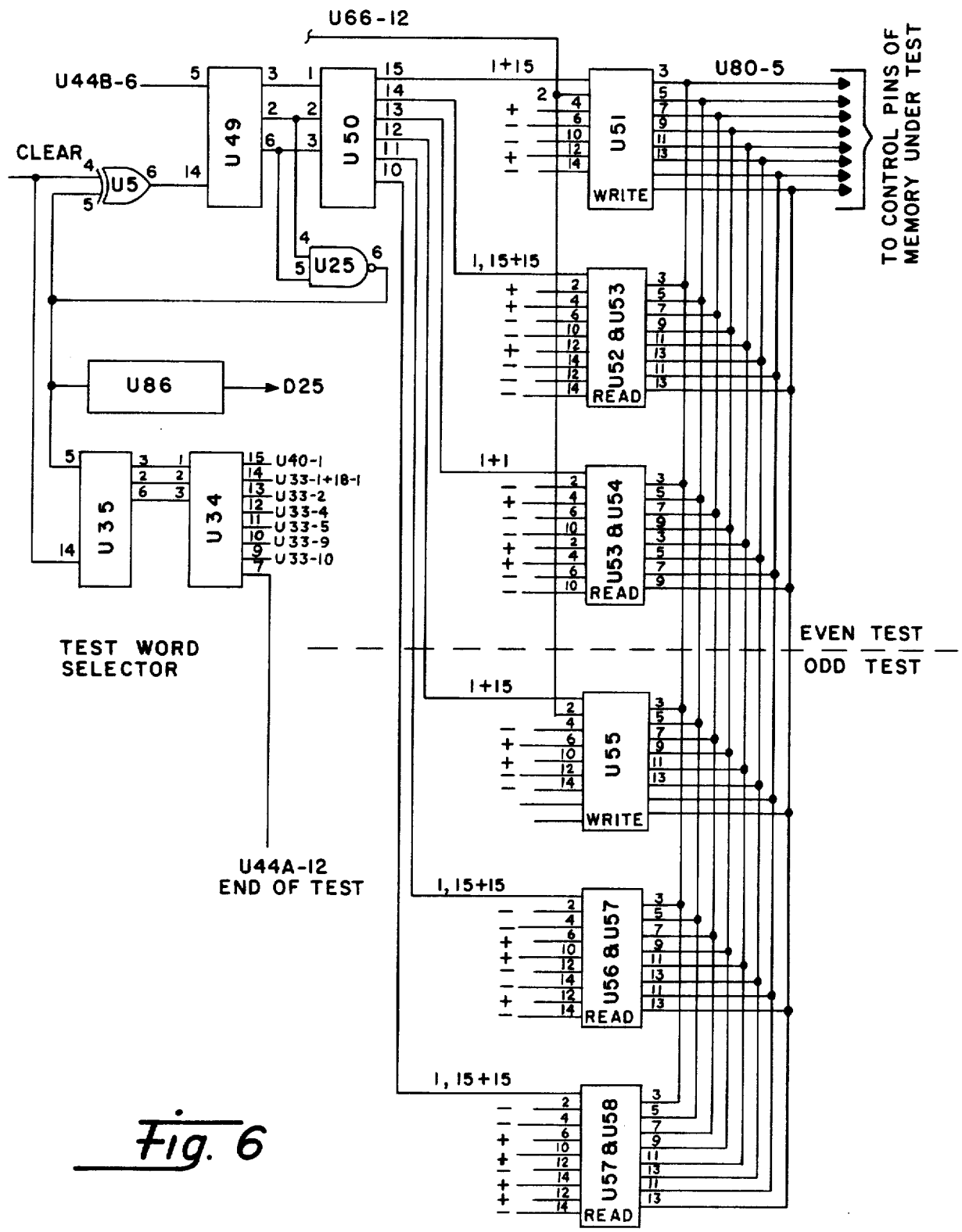
FIG. 6 is a schematic diagram of the test select and write/read circuits.

The function of the word generators is to produce alternate ones and zeros, alternate zeros and ones, all zeros, and finally all ones. Formation of test words 4 and 5 utilize the least significant bit (LSB) from the output of the address counter (FIG. 2). Words 6 and 7 are developed by inhibiting the LSB and using the output of an inverting and noninverting buffer amplifier circuit The LSB is connected to pin 1 of NAND gate U25, with pin 2 connected to output pin 6 of hex inverter U32 which is driven by the output of exclusive OR gate U33. The inputs to gate U33 (pins 9 and 10) are supplied by multiplexer U34 from the test word selector (FIG. 6). As long as pins 9 and 10 of gate U33 are at the same logic levels, pin 8 of U33 will remain low. Inverter U32 converts this low level to a high and sends it to pin 2 of NAND gate U25. With pin 2 of gate U25 high, the output (pin 3) will be under control of the address counter LSB signal. Since the LSB signal will alternate with every other clock pulse, it makes an ideal signal for producing ones and zeros which is then inverted by hex inverter U26A and fed to pins 3, 5, 9 and 11 of hex inverters U26B and to pins 2, 5, 9 and 12 of noninverting gates U31. The outputs of hex inverters U26B (pins 4, 6, 8 and 10) which are both amplified and inverted, are fed to four of the eight inputs of multiplexers U27-U30. At the same time, the outputs of noninverting buffer gates U31 are amplified and fed to the other four inputs of the multiplexers.

Selection of inverted or noninverted input data is determined by the logic value on pin 1 of the multiplexers. Pin 1 is connected to the LSB (pin 3) of binary counter U35 (FIG. 6), which alternates from one logic state to the other during every other test word. The output of the multiplexers U27-U30 are energized when either pins 4, 5, 9 or 10 of exclusive OR gate U33 are at a logic low, thus allowing the selected input data to be relayed to the data bus for transfer to the data inputs of the internal memory and memory under test. However, when pins 9 or 10 are logically low, the signal applied to pin 2 of NAND gate U25 causes test words 6 and 7 to be generated. With pin 9 or 10 of exclusive OR gate U33 low, pin 2 of U25 will also be low. This will disable the alternate ones/zeros and provide a constant high to pin 1 of hex inverter U26A. The high is inverted to a low and applied to the input pins of hex inverters U26B and noninverting gates U31. With a high on pin 1 of multiplexers U27-U30, test word 6 (all zeros) will be applied to the data bus. When pin 1 returns to a logic low, test word 7 (all ones), will be selected.

TEST SELECT AND WRITE/READ CIRCUIT

The test select and write/read circuit is shown in FIG. 6. The test word selector consists of a binary counter U35 and a multiplexer U34. The binary counter is cleared by the master clear switch S2 (FIGS. 1 and 2) and increments whenever pin 5 transitions from a low to a high logic level. The output of binary counter U35 is applied to the input of multiplexer U34. The multiplexer operates to select the seven test words sequentially as the test data. After all seven test words have been selected, a logic low appears on pin 7 of multiplexer U34 and is applied to NAND gate U44A (FIG. 2), pin 12 causing the clock input to the address counter (FIG. 2) to be disabled. This signifies the end of the test, and occurs only when all seven tests have been accomplished without a failure.

The write/read circuit consists of binary counter U49, multiplexer U50, exclusive OR gate U5, NAND gate U25, and noninverting buffer amplifiers U51-U58.

The overall write/read circuit operation is as follows. Operation of master clear switch S2 (FIGS. 1 and 2) sets both binary counters U35 and U49 to zero. The output of multiplexer U50 enables buffer amplifier U51 with a logic low, and disables all the other buffer amplifiers with a logic high. The buffer amplifiers are pre-wired to provide appropriate control logic for write and read functions of the internal memory and memory under test. With amplifier U51 enabled, the first test word is loaded into storage.

Figure 8:
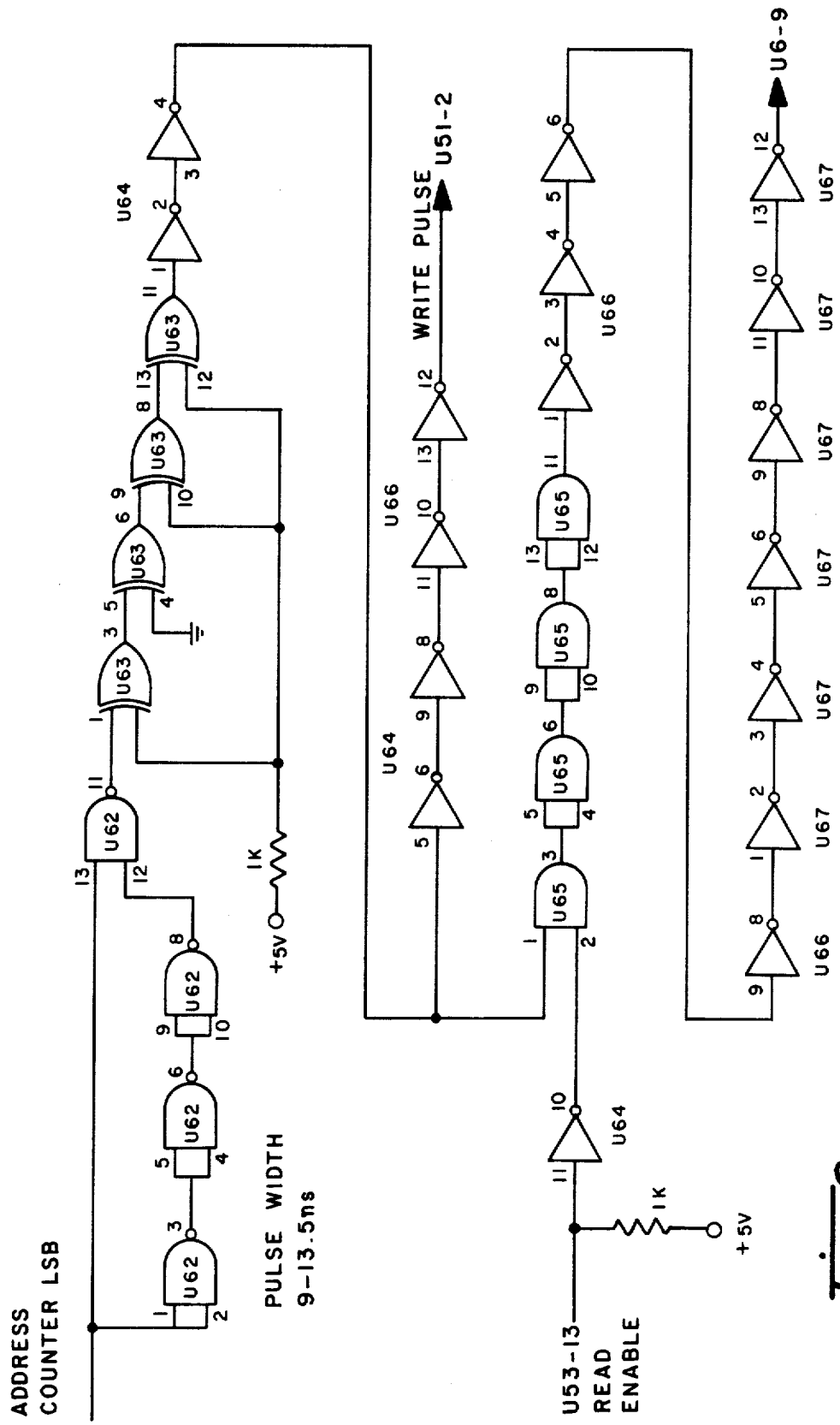
FIG. 8 is a schematic diagram of the timing circuit for the write/read circuit of FIG. 6 and the data/fault circuit of FIG. 7.

The timing circuit for the write/read circuit is shown in FIG. 8. The circuit comprises NAND gates U62, exclusive OR gates U63, and hex inverters U64 and U66.

The LSB from the address counter (FIG. 2) is applied to pins 1, 2 and 13 of NAND gates U62, producing a logic low pulse of approximately 9-13.5 ns on output pin 11 every LSB positive pulse. The pulse width is determined by using the built-in delay of NAND gates U62. The output of NAND gate U62 is channeled through a series of exclusive OR gates U63 which delay and invert the logic low pulses to logic high pulses. The output of exclusive OR gates U63 (pin 11) is applied to hex inverters U64 and U66 where it is further delayed before emerging at pin 12 as a logic high. The signal is then applied to amplifiers U51 and U55 as the write pulse used for loading test words into the internal memory and the memory under test.

When the address counter reaches a count of 2048, it enables NAND gate U44B (FIG. 2) causing pin 5 of binary counter U49 to transition from a low to a high. Binary counter U49 output will then show a binary output of 001. This causes multiplexer U50 to enable buffer amplifier U52 and part of U53, and to disable U51. The minicomputer is now in the read mode and ready to compare the information stored in its internal memory to that stored in the memory card under test.

DATA FAULT CIRCUIT

Figure 7:
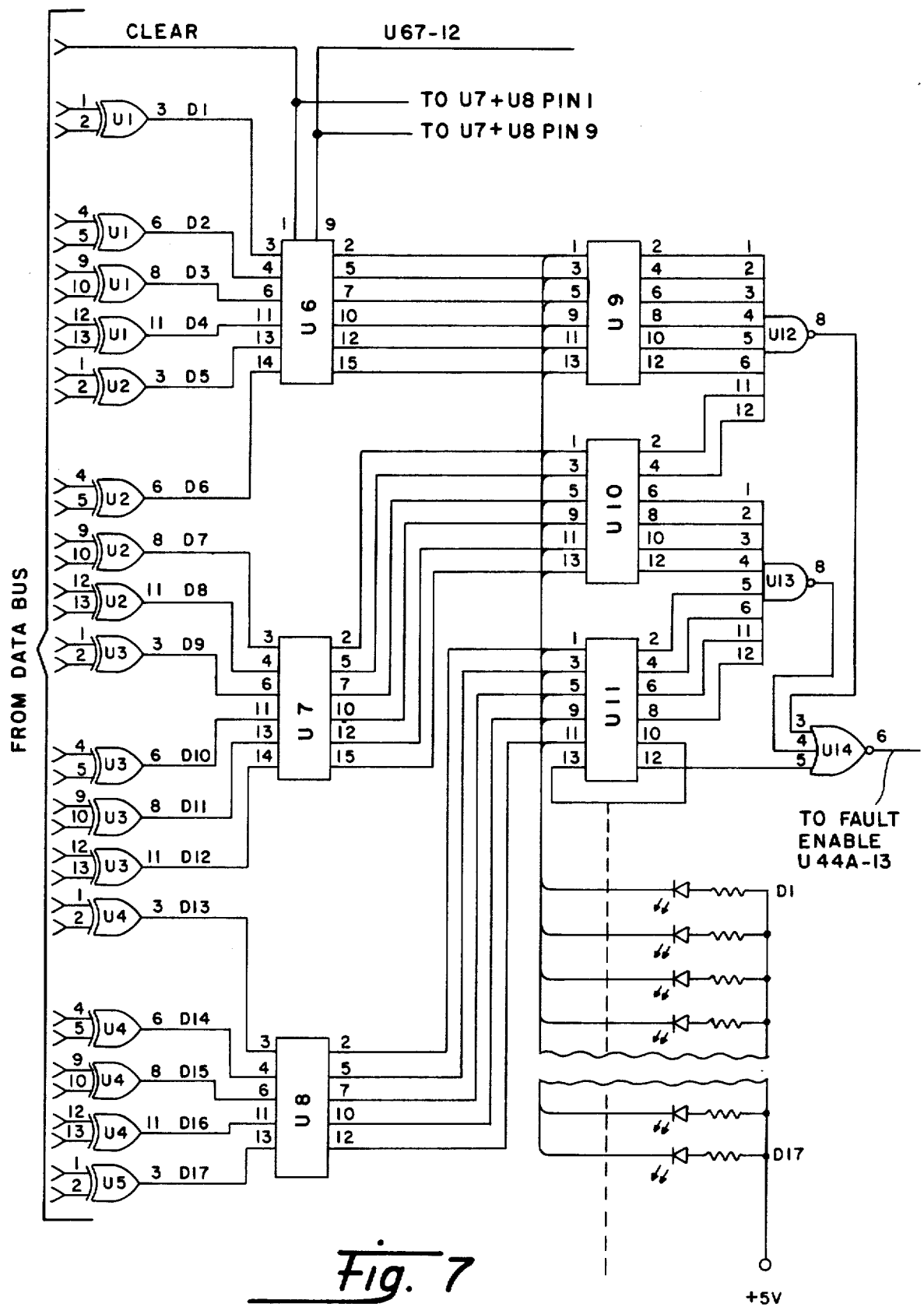
FIG. 7 is a schematic diagram of the data/fault circuit.

Once a test word is loaded into the internal memory and the memory under test, the minicomputer tester automatically switches to the data fault circuit. This circuit is shown in FIG. 7 and consists of exclusive OR gates U1-U5, data latches U6-U8, inverting amplifiers U9-U11, decoders U12-U14, and light emitting diodes (LEDs) D1-D17.

With write/read circuit in the read mode, data in the minicomputer internal memory and the memory under test are read out to the data bus and transferred to inputs of exclusive OR gates U1-U5. The exclusive OR gates compare the two memories data and any differences in data bits causes the exclusive OR gates to apply a logic high to the inputs of the data latches U6-U8. Information stored in data latches U6-U8 are applied through inverting amplifiers U9-U11 to fault decoders U12-U14. The output of the final decoder (U14 pin 6) applies a logic low to NAND gate U44A, pin 13 if any of the data latches have been set, thereby inhibiting the address counter (FIG. 2).

Referring once again to FIG. 8, the timing circuit for the data/fault circuit comprises hex inverters U64, U66-U67 and NAND gates U65.

Logic high output pulses from hex inverter U64 pin 4, are also applied to pin 1 of NAND gate U65, thus enabling the output of gate U65 (pin 3) to be controlled by the read enable signal from amplifier U53 pin 13 (FIG. 6). During the write mode of operation, pin 13 of amplifier U53 is turned off (high impedance state). A resistor is connected to pin 11 of hex inverter U64 to insure a high logic level on pin 11 during the write mode. The output of hex inverter U64 (pin 10) will then be a logic low preventing positive pulses from being gated through NAND gate U65. As long as the minicomputer is in the write mode, input pin 2 of NAND gate U65 will remain low. When a count of 2048 has been reached by the address counter, the minicomputer switches to the read mode. The logic level of amplifier U53 pin 13 will then go low and be inverted by hex inverter U64 and applied to NAND gate U65 pin 2, thereby allowing positive pulses to be gated through NAND gate U65. The additional NAND gates U65 and hex inverters U66 are used to delay the pulses to compensate for delay time in the switching functions of output multiplexers contained in the memory cards of the general purpose signal processor. Since the internal memory does not have multiplexers in the output circuit, its data will arrive at the exclusive OR gates U1–U5 a few nanoseconds before that of the unit under test. The additional delays provided by NAND gates U65 and hex inverters U66–U67 are designed to compensate for this discrepancy.

Figure 9:
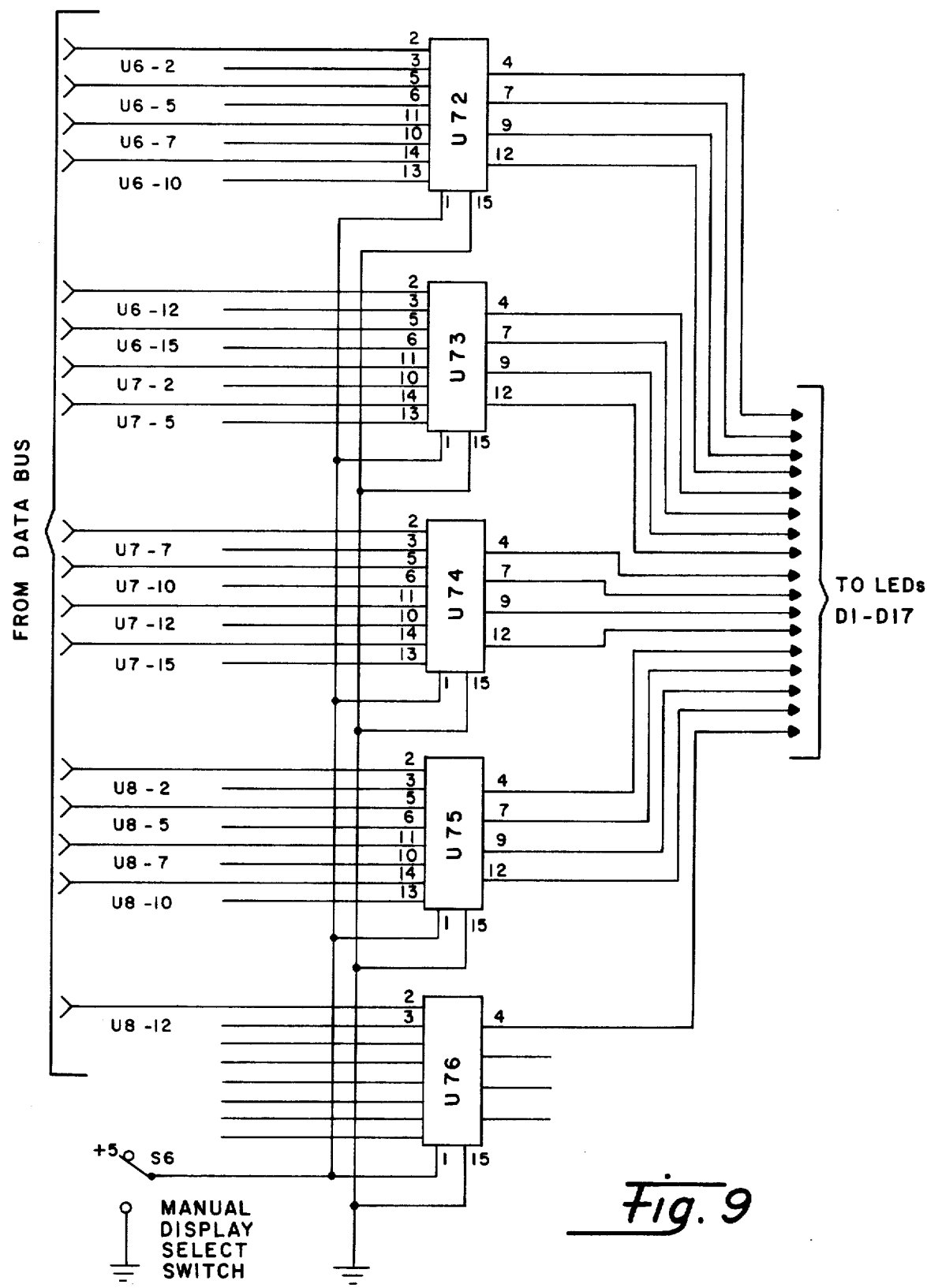
FIG. 9 is a schematic diagram of the data/fault select circuit.

Turning now to FIGS. 7 and 9, the address location of particular faults on the memory card under test are determined from the data latches U6–U8 by setting the manual display select switch S6 on the front panel. It is noted that the switch has two modes, a "data" mode and a "fault" mode. In the data mode a logic low is applied to pin 1 of a plurality of multiplexers U72–U76, allowing test word data from the data bus to be coupled from input lines 2, 5, 11 and 14 to LEDs D1–D17 which are arranged in series on the front panel. Logic highs and lows of individual bits making up the test words causes individual LEDs to illuminate or to turn off, thereby permitting test words to be observed by the operator as they are loaded into the memories.

Setting the switch S6 to the "fault" mode applies a logic high to pin 1 of multiplexers U72–U76, causing input signals on lines 3, 6, 10 and 13 of the multiplexers to be connected to the LEDs.

The logic high applied to the data latch indicating a faulty bit will cause a logic high to be applied through multiplexers U72–U76 to the cathode of a LED causing it to turn off. The operator is able to determine from the LED the exact bit location of the fault on the memory card under test with the aid of conversion tables. The memory cards of the general purpose signal processor comprise individual IC (1K by 1 bit) RAM chips and output multiplexers arranged in rows A–E and columns 1–17. Because the radar system accesses only half the memory card at a time, the cards are divided into halves with the first half denoted as even and the other half denoted as odd. Below listed are even and odd memory fault tables 1 and 2 for converting a faulty bit indication to the location (row, column and bit) on the memory card under test.

TABLE I

EVEN MEMORY FAULT

| FAULT BITS | ADDRESS ≤1023 | ADDRESS ≥1024 |
|---|---|---|
| 1 | D17 U42 | E17 U35 |
| 2 | D16 U43 | E16 U36 |
| 3 | D15 U44 | E15 U37 |
| 4 | D14 U45 | E14 U38 |
| 5 | D13 U46 | E13 U39 |
| 6 | D12 U47 | E12 U40 |
| 7 | E10 U48 | E11 U41 |
| 8 | D10 U56 | D11 U49 |
| 9 | B17 U57 | C17 U50 |
| 10 | B16 U58 | B15 U52 |
| 11 | C16 U59 | C15 U53 |
| 12 | C13 U60 | C14 U53 |
| 13 | B13 U61 | B14 U54 |
| 14 | B12 U62 | C12 U55 |
| 15 | B11 U66 | C11 U63 |
| 16 | B10 U67 | C10 U64 |
| 17 | A17 U68 | A16 U65 |

The symbol "≤", means less than or equal to.
The symbol "≥", means greater than or equal to.

TABLE II

ODD MEMORY FAULT

| FAULT BITS | ADDRESS ≤1023 | ADDRESS ≥1024 |
|---|---|---|
| 1 | D1 U8 | E1 U1 |
| 2 | D2 U9 | E2 U2 |
| 3 | D3 U10 | E3 U3 |
| 4 | D4 U11 | D5 U4 |
| 5 | E4 U12 | E5 U5 |
| 6 | D6 U13 | E6 U6 |
| 7 | D7 U14 | E7 U7 |
| 8 | D8 U22 | E8 U15 |
| 9 | B2 U23 | B1 U16 |
| 10 | C2 U24 | C1 U17 |
| 11 | B3 U25 | C3 U18 |
| 12 | B4 U26 | C4 U19 |
| 13 | B5 U27 | C5 U20 |
| 14 | B6 U28 | C6 U21 |
| 15 | B7 U32 | C7 U29 |
| 16 | B8 U33 | C8 U30 |
| 17 | A2 U34 | A1 U31 |

The symbol "≤", means less than or equal to.
The symbol "≥", means greater than or equal to.

If a fault does not occur and the data latches are not set then the address counter will clear itself at a count of 2048, and on the next count of 2048, binary counter U49 will increment to a binary code of 010. This code enables amplifier U54 to test extra address lines of the memory cards of the general purpose signal processor. If no fault occurs during this part of the test, multiplexer U50 enables buffer amplifiers U55–U58 in the same manner as amplifiers U51–U54 to repeat the test on the second (i.e., odd) half of the memory card under test. At the end of this test, the binary counter U49 will increment to a binary code of 110, causing NAND gate U25 to produce a momentary pulse to exclusive OR gate U5 to clear the binary counter U49. The pulsing of gate U25 is also used to increment the binary counter U35 by a count of one (001) for the selection of test word No. 2. In this manner, testing continues until a fault has been detected or until all seven test words have been sequenced. A decade counter U86 connected to output pin 6 of NAND gate U25 produces a decimal count corresponding to binary counter U35. The output of decade counter U86 drives a 7-segment LED numeric readout indicator D25 located on front panel 12 of the minicomputer to identify the particular test word currently in use. The decade counter U86 is cleared by the master clear switch S2.

Figure 10:
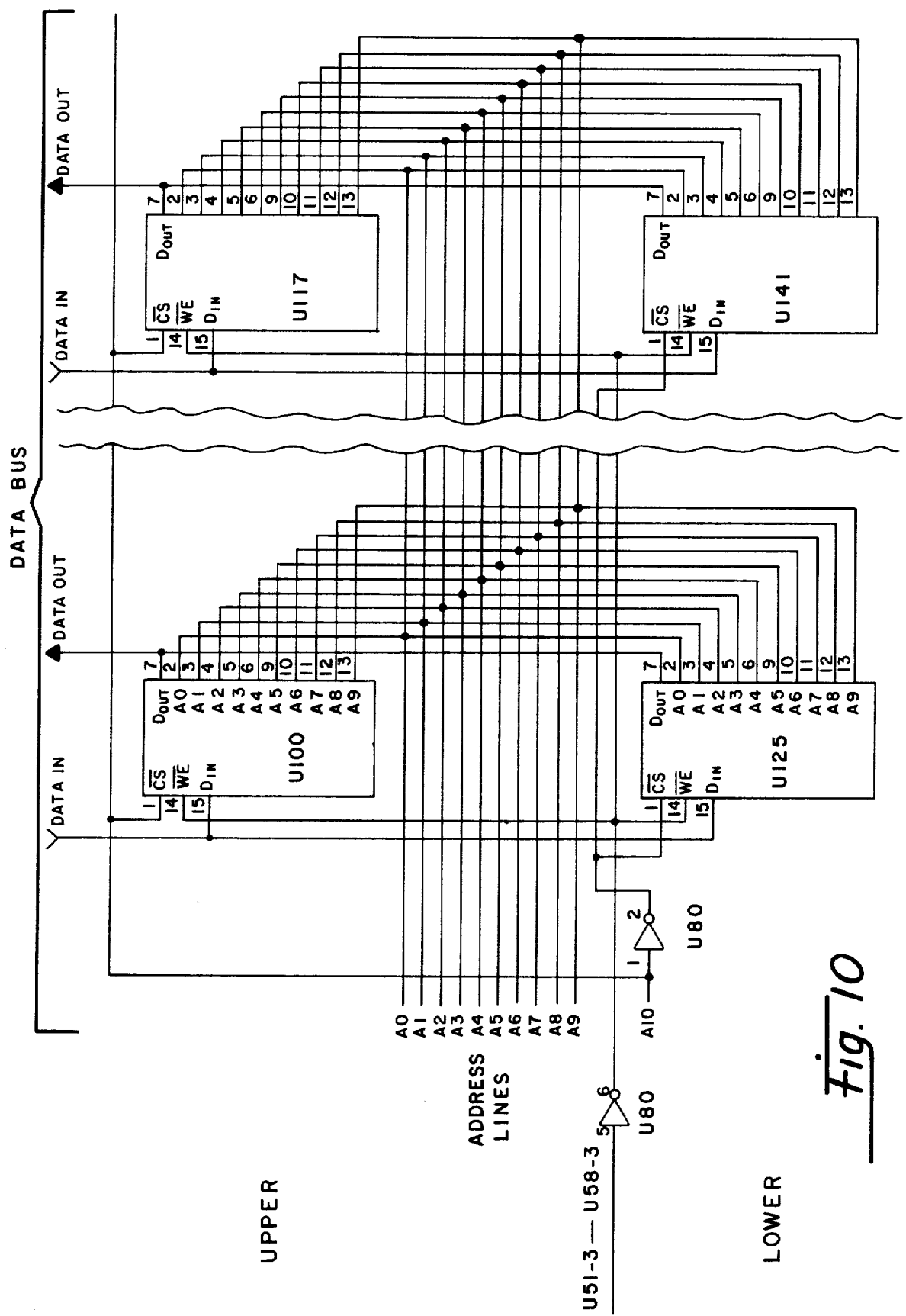
FIG. 10 is a block diagram of the internal memory.

Referring to FIG. 10, the internal memory comprises an upper section U100–U117 and a lower section U125–U141 of 1K by 1 bit RAM chips (1024 bits/chip). The address lines of each chip are connected to the output of the address counter (FIG. 2). The output of the address counter is also connected to the memory card under test. The data in and data out lines of the upper and lower memory sections share common bus lines.

When the address counter is cleared, logic lows are applied to address lines pins A0 to A10. The low on pin A10 is inverted to a high by hex inverter U80 to disable the lower memory section. Positive pulses from pin 3 of buffer amplifiers U51–U58 (FIG. 6) applied to pin 5 of hex inverter U80 are inverted and applied to pin 14 of the RAM chips. These pulses control the loading in of data on pin 15 of each chip. When the address counter (FIG. 2) reaches a count of 1024, pin A10 will go high and disable the upper memory section and enable the lower memory section. The address counter will continue counting while the pulses from buffer amplifiers U51–U58 control the loading in of data on pin 15. When the address counter reaches a count of 2048, signals applied to inverter U80, pin 5 and address pin A10 will go low and the upper memory is in condition to read data out of pin 7 of each memory chip to the data bus for transmission to the fault circuit for comparison with data in the memory under test.

Thus, while preferred features of the present invention are embodied in the structure illustrated herein, it is to be understood that changes and variations may be made by those skilled in the art without departing from the spirit and scope of the invention. For example, while the invention is specifically disclosed for application in the testing of memory cards of the general signal processor of the AN/FPS-115 radar system, the invention may easily be modified for use in testing other random access memories.

I claim:

1. A portable minicomputer for testing a random access memory wherein the memory comprises an array of individual memory chips each containing a multitude of address bits, said portable minicomputer comprising:
    a central processing unit;
    an internal memory connected to said central processing unit;
    means for connecting a memory under test to said central processing unit, said central processing unit including an address counter means for incrementing address lines of said internal memory and said memory under test, and means for generating a plurality of test words;
    means for writing said test words into said internal memory and said memory under test;
    means for reading said test words out of said internal memory and said memory under test after said address counter means reaches a predetermined address count;
    means for comparing said test words read out of said internal memory and said memory under test, said last mentioned means including a fault display indicating a discrepancy between test word bits; and
    fault conversion means comprising a table of fault display indicia and memory chip addresses for converting a discrepancy identified by said fault display into the address bit location of an individual memory chip in said memory under test.

2. The portable minicomputer according to claim 1, wherein said means for generating a plurality of test words includes a first test word generator comprising noninverting buffer amplifiers connected to the input of said address counter means.

3. The portable minicomputer according to claim 2, wherein said means for generating a plurality of test words includes second and third test word generators comprising a plurality of microswitches and shift registers, and a test word selector circuit means, said microswitches programmed to provide a preselected series of pulses to the input of said shift registers, said means further including a first plurality of multiplexers connected to the output of said registers, and wherein certain of the outputs of said registers have inverters connected between the outputs of the registers and the multiplexers, the outputs of said multiplexers selectivity producing the inverted or noninverted outputs of said shift registers as the second and third test words as a result of a control signal from said test word selector circuit means applied to said multiplexers.

4. The portable minicomputer according to claim 3, wherein said means for generating a plurality of test words includes fourth, fifth, sixth and seventh test word generators comprising a NAND gate, a plurality of inverting and noninverting gates, and a second plurality of multiplexers, the input of said NAND gate connected to a least significant bit output of said address counter means and to said test word selector circuit means, the output of said NAND gate connected through parallel banks of said inverting and noninverting gates to the inputs of said second plurality of multiplexers, the outputs of said last mentioned multiplexers selectively producing said fourth, fifth, sixth and seventh test words as a result of a control signal from said test word selector circuit means applied to said NAND gate and to said second plurality of multiplexers.

5. The portable minicomputer according to claim 4, wherein said test word selector circuit means includes a binary counter connected to a multiplexer, the output of said multiplexer producing a plurality of control signals which energize the seven test word generator means in a sequential manner.

6. The portable minicomputer according to claim 5, wherein said means for comparing said test words includes a plurality of exclusive OR gates connected to the data outputs of said memory under test and the internal memory.

7. The portable minicomputer according to claim 6, wherein said fault display includes data latches connected to the outputs of said exclusive OR gates, and to said address counter means, and operative to inhibit said address counter means if the outputs of said exclusive OR gates indicate any discrepancies in test word data.

8. The portable minicomputer according to claim 7, wherein said fault display further includes a digital display readout connected to said data latches, said digital display readout including a light emitting diode connected to each data latch to provide a visual indication of the particular exclusive OR gate showing a discrepancy.

9. The portable minicomputer according to claim 5, further including a source of clock signals to drive said address counter means and said binary counter.

10. The portable minicomputer according to claim 9 wherein said clock signals are between 10 KHz and 6 MHz.

11. The portable minicomputer according to claim 1, wherein said internal memory includes two sets of 1K by 1 bit RAM chips, said address counter means producing a signal for enabling one set of RAM chips in the write mode during a first portion of said predetermined address count, and enabling the other set of RAM chips in the write mode during a remaining portion of said predetermined address count.

12. The portable minicomputer according to claim 1, wherein said means for writing and said means for reading test words into and out of the internal memory and the memory under test includes a write/read circuit comprising a binary counter connected to a multiplexer, the output of the multiplexer connected to a plurality of buffer amplifier means, said buffer amplifier means connected to the internal memory and the memory under test and producing logic signals for controlling write and read functions of the memories.

13. The portable minicomputer according to claim 12, wherein said write/read circuit further includes timing circuit means for producing write and read pulses for the internal memory and the memory under test.

* * * * *